United States Patent
Kinoshita

(10) Patent No.: US 9,716,132 B2
(45) Date of Patent: Jul. 25, 2017

(54) DISPLAY DEVICE AND ELECTRONIC APPARATUS

(71) Applicant: Sony Corporation, Tokyo (JP)

(72) Inventor: Tomoatsu Kinoshita, Tokyo (JP)

(73) Assignee: Sony Corporation, Tokyo (JP)

(*) Notice: Subject to any disclaimer, the term of this patent is extended or adjusted under 35 U.S.C. 154(b) by 256 days.

(21) Appl. No.: 14/172,164

(22) Filed: Feb. 4, 2014

(65) Prior Publication Data
US 2014/0291685 A1    Oct. 2, 2014

(30) Foreign Application Priority Data
Mar. 26, 2013    (JP) .................................. 2013-063804

(51) Int. Cl.
H01L 33/00    (2010.01)
H01L 27/32    (2006.01)
H01L 27/12    (2006.01)

(52) U.S. Cl.
CPC ........ H01L 27/3265 (2013.01); H01L 27/124 (2013.01); H01L 27/1225 (2013.01); H01L 27/3262 (2013.01)

(58) Field of Classification Search
CPC .............. H01L 27/124; H01L 27/3241; H01L 27/3244; H01L 27/3262; H01L 27/3265; H01L 27/326

USPC ............................................................ 257/59
See application file for complete search history.

(56) References Cited

U.S. PATENT DOCUMENTS

| | | | |
|---|---|---|---|
| 7,338,338 B2* | 3/2008 | Tsai ....................... | H01L 27/322 445/23 |
| 2003/0016310 A1* | 1/2003 | Lee .................... | G02F 1/136213 349/43 |
| 2003/0098657 A1* | 5/2003 | Suzuki ................. | G09G 3/3233 315/169.3 |
| 2003/0098934 A1* | 5/2003 | Lee .................... | G02F 1/136213 349/39 |
| 2014/0043372 A1* | 2/2014 | Xi ....................... | H01L 27/3276 345/690 |

FOREIGN PATENT DOCUMENTS

JP    2003-271095 A    9/2003

* cited by examiner

*Primary Examiner* — Kenneth Parker
*Assistant Examiner* — John Lin
(74) *Attorney, Agent, or Firm* — Michael Best & Friedrich LLP

(57) ABSTRACT

A system suppresses a variation in luminance for each pixel by appropriately suppressing a variation in the parasitic capacitance of a sampling transistor. The system may include a pixel comprising a first transistor having a first deviation that results in a parasitic capacitance and a compensation element having a second deviation that results in a compensatory capacitance that compensates for the parasitic capacitance

20 Claims, 15 Drawing Sheets

FIRST METAL LAYER

SECOND METAL LAYER

CHANNEL LAYER

CONTACT PORTION

INCREASE IN CAPACITANCE DUE TO DEVIATION

FIRST METAL LAYER

SECOND METAL LAYER

CHANNEL LAYER

CONTACT PORTION

US 9,716,132 B2

DISPLAY DEVICE AND ELECTRONIC APPARATUS

CROSS REFERENCE TO RELATED APPLICATIONS

This application claims the benefit of Japanese Priority Patent Application JP 2013-063804 filed Mar. 26, 2013, the entire contents of which are incorporated herein by reference.

BACKGROUND

The present disclosure relates to a display device and an electronic apparatus, and more particularly, to a display device and an electronic apparatus which can suppress a variation in luminance for each pixel.

In recent years, flat self-luminous type panels (hereinafter, referred to as "organic EL panels") which use an organic electro luminescent (EL) element as a light-emitting element in a pixel have been developed. The organic EL element is an element having a diode characteristic and using a phenomenon in which light is emitted when an electric field is applied to an organic thin film.

In addition, among organic EL panels, in particular, active matrix type organic EL panels with thin film transistors, as driving elements, being integrally formed in each pixel have been actively developed.

In this type of organic EL panel, each pixel usually includes an organic EL element, a holding capacitor, a sampling transistor for sampling an image signal, and a driving transistor for driving the organic EL element. In other words, light emission luminance of the pixel is adjusted by controlling a driving current supplied to the organic EL element by the driving transistor.

However, in general, thin film transistors formed of a-Si, p-Si, or an oxide semiconductor has a large variation. Further, a variation also occurs in the capacity of a driving transistor due to the influence of the large variation. When a driving capacity of the driving transistor varies between pixels, the variation appears as a luminance difference between the pixels, and thus the variation may be perceived as unevenness for the organic EL panel.

For this reason, various techniques for avoiding such a phenomenon have been proposed. For example, Japanese Unexamined Patent Application Publication No. 2003-271095 discloses a technique for compensating for a difference in capacity of a driving transistor.

SUMMARY

Japanese Unexamined Patent Application Publication No. 2003-271095 discloses a technique that retains a potential equivalent to a threshold voltage of a driving transistor as a gate potential to correct the threshold voltage.

However, in this technique, when a gate potential of a sampling transistor is changed after retaining the potential equivalent to the threshold voltage, a gate potential of the driving transistor changes due to parasitic capacitances of a gate and a source of the sampling transistor. As a result, a correction value of the threshold voltage of the driving transistor changes due to a variation in parasitic capacitance, and thus a variation in luminance occurs in each pixel.

As described above, in an organic EL panel, a variation in luminance for each pixel is desired to be suppressed. In turn, a variation in the parasitic capacitance of a sampling transistor is desired to be suppressed.

The present disclosure is contrived in view of such situations, and may suppress a variation in luminance for each pixel by appropriately suppressing a variation in the parasitic capacitance of a sampling transistor.

In view of the above, the following description relates to a pixel circuit comprising a first transistor having a first deviation that results in a parasitic capacitance and a compensation element having a second deviation that results in a compensatory capacitance that compensates for the parasitic capacitance.

Further, the following may relate to a pixel circuit, comprising a first transistor; a holding capacitor; a first metal portion connected to the holding capacitor; and a second metal portion, wherein the first transistor includes a channel portion connected to the first metal portion, the first metal portion includes a first edge and a second edge opposite to the first edge, the first edge is disposed to overlap with a gate electrode of the first transistor, the second edge is disposed to overlap with the second metal portion, and the gate electrode of the first transistor and the second metal portion are the same material. The gate electrode of the first transistor may be arranged at a same layer as the second metal portion.

According to the embodiments of the present disclosure, it is possible to suppress a variation in luminance for each pixel.

DETAILED DESCRIPTION OF EMBODIMENTS

Hereinafter, an embodiment will be described with reference to the accompanying drawings.

Configuration of Organic EL Panel

Figure 1:
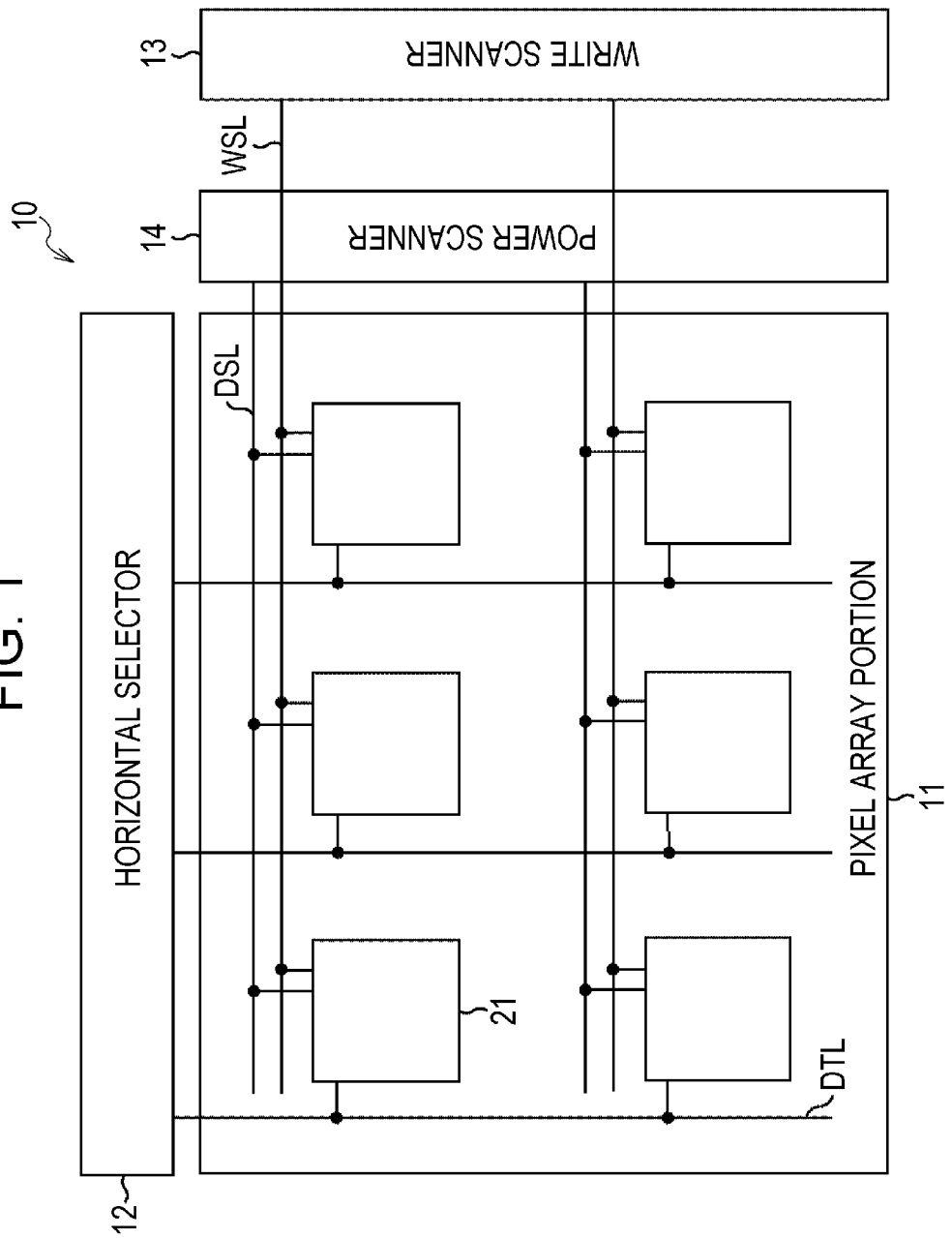
FIG. 1 is a diagram illustrating a configuration example of an organic EL panel.

FIG. 1 is a diagram illustrating a configuration example of an organic EL panel. However, an organic EL panel 10 of FIG. 1 is indicative of a configuration of a panel serving as a main portion of a display device to which the present disclosure is applied.

The organic EL panel 10 of FIG. 1 includes a pixel array portion 11 in which M×N (M=1, 2, ..., m; N=1, 2, ..., n) pixels (pixel circuits) 21 are arranged in a matrix, and a driving unit for driving the pixel array portion. The driving unit is provided with a horizontal selector 12, a write scanner 13, and a power scanner 14.

In addition, the organic EL panel 10 includes M scanning lines WSL, M power lines DSL, and N image signal lines DTL. Each pixel 21 is disposed in a portion where the row-like scanning line WSL and the column-like image signal line DTL intersect with each other. Each pixel is also connected to the write scanner 13 through the scanning lines WSL, is connected to the power scanner 14 through the power lines DSL, and is connected to the horizontal selector 12 through the image signal lines DTL.

The write scanner 13 may sequentially supply a control signal to the scanning line WSL with a horizontal period (1H) to thereby line-sequentially scan the pixel 21 in row units. The power scanner 14 may supply a power supply voltage to the row-like power line DSL in accordance with the line-sequential scanning. The horizontal selector 12 may supply a signal potential serving as an image signal and a reference potential to the column-like image signal line DTL in accordance with the line-sequential scanning.

A driver integrated circuit (IC) constituted by a source driver and a gate driver may be added to the organic EL panel 10 that is configured as illustrated in FIG. 1, thereby configuring a panel module. Furthermore, a display device may be formed by adding a power supply circuit, an image large scale integration (LSI) and the like to the panel module.

Meanwhile, for the purpose of simplifying the description, FIG. 1 illustrates only 2×3 pixels 21, among the M×N pixels 21 that are arranged in the pixel array portion 11.

Configuration of Pixel

Next, detailed description will be given of the pixels 21 that are arranged in a matrix in the pixel array portion 11 of the organic EL panel 10 illustrated in FIG. 1. However, herein, to facilitate the understanding of the present disclosure and to clarify the background thereof, a configuration of a general pixel will be described with reference to FIGS. 2 to 4B.

Configuration of General Pixel

Figure 2:
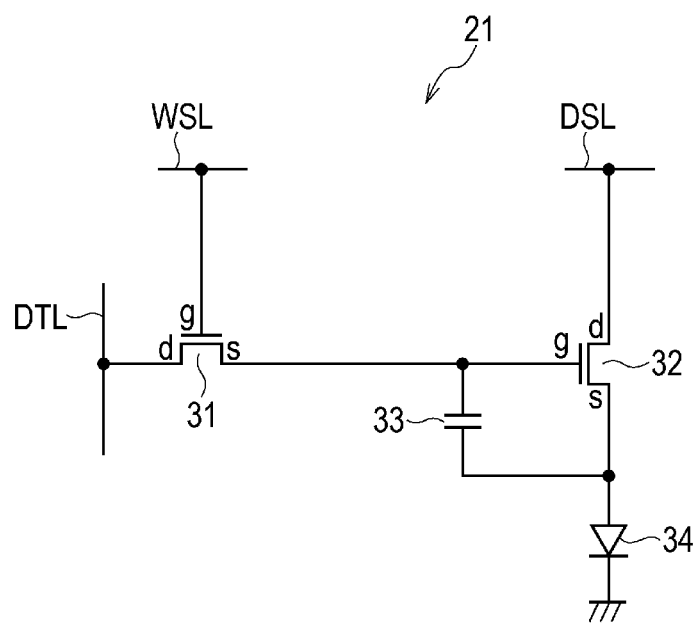
FIG. 2 is a circuit diagram illustrating a configuration of a pixel.

The pixel 21 of FIG. 2 includes a sampling transistor 31, a driving transistor 32, a holding capacitor 33, and a light-emitting element 34. In the sampling transistor 31, a gate g is connected to the scanning line WSL, a drain d is connected to the image signal line DTL, and a source s is connected to a gate g of the driving transistor 32.

One of a source s and a drain d of the driving transistor 32 is connected to an anode of the light-emitting element 34, and the other is connected to the power line DSL. The holding capacitor 33 is connected to the gate g of the driving transistor 32 and the anode of the light-emitting element 34. In addition, a cathode of the light-emitting element 34 is grounded.

In FIG. 2, when the sampling transistor 31 is turned on in response to the control signal that is supplied from the scanning line WSL, the holding capacitor 33 accumulates and holds charges that are supplied from the horizontal selector 12 through the image signal line DTL. The driving transistor 32 receives a current from the power line DSL, and applies a driving current to the light-emitting element 34 in response to a signal potential that is held in the holding capacitor 33. A predetermined driving current flows to the light-emitting element 34, and thus the pixel 21 emits light.

Layout of Wiring Pattern of General Pixel

Figure 3:
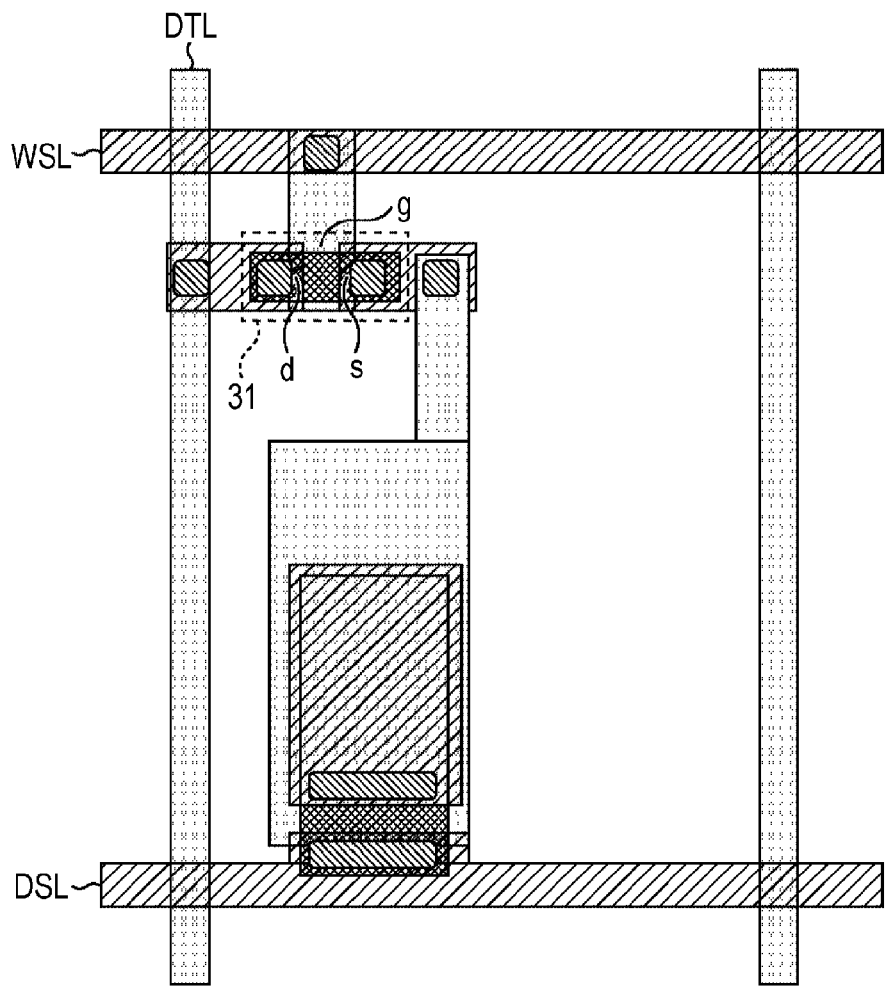
FIG. 3 is a diagram illustrating a layout of a wiring pattern of the pixel.
Figure 3:
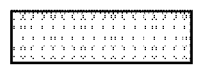
Figure 3:
Figure 3:
Figure 3:

FIG. 3 is a diagram illustrating a layout of a wiring pattern of the pixel 21 of FIG. 2. For the purpose of simplifying the description, a description of the sampling transistor 31 structure is given.

As illustrated in FIG. 3, the image signal line DTL is formed of a first metal layer, and the scanning line WSL and the power line DSL are formed of a second metal layer.

The sampling transistor 31 may be equivalent to the first metal layer, the second metal layer, and a portion of a channel layer within the dotted line thereof, and may be formed as a thin film transistor. In the sampling transistor 31, the gate g thereof may be formed of the first metal layer and may be connected to the scanning line WSL through a contact portion.

In addition, in the sampling transistor 31, the source s and the drain d may be formed of the second metal layer. The source s may be connected to the gate g of the driving transistor 32 and the holding capacitor 33. In addition, the drain d is connected to the image signal line DTL through the contact portion.

Although not specifically shown in FIG. 3, the driving transistor 32 may be provided as a thin film transistor that is formed to include the first metal layer, the second metal layer, and the channel layer. In addition, the holding capacitor 33 may be provided as a capacitor that is formed to include a conductor, which is constituted by the first metal layer and the second metal layer, and an insulator provided there between.

Further, when an error (e.g., patterning and/or manufacturing errors) in line width between the first metal layer and the second metal layer occurs in a manufacturing process, the parasitic capacitance of the sampling transistor 31 increases. For instance, the parasitic capacitance of the sampling transistor 31 may vary due to a patterning errors during a process of forming the first metal layer and the second metal layer, such as when forming the first metal layer as the gate g of the sampling transistor 31 and forming the second metal layer as the source s of the sampling transistor 31.

In other words, a variation in the parasitic capacitance of the sampling transistor 31 may be caused by a variation in the line width of the first metal layer as the gate g of the sampling transistor 31 and/or a variation in the line width of the second metal layer as the source s of the sampling transistor 31.

Figure 4A:
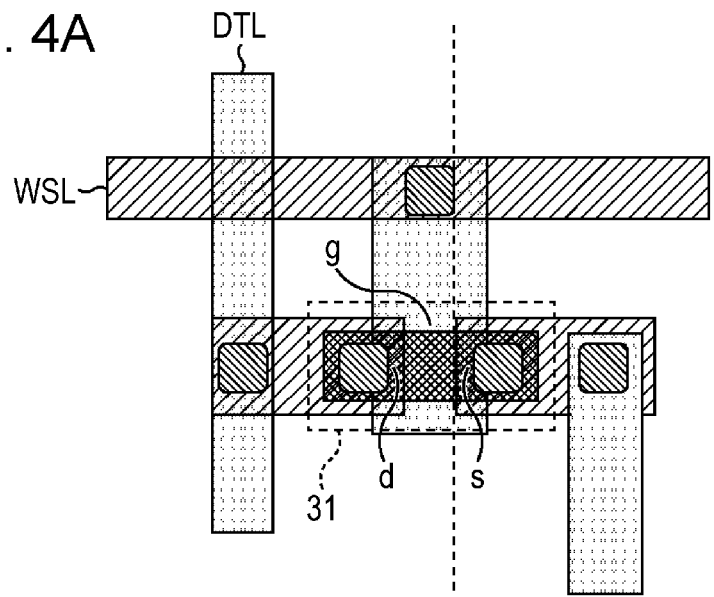
FIGS. 4A and 4B are diagrams illustrating an increase in capacitance due to deviation of a metal layer in the general pixel.
Figure 4B:
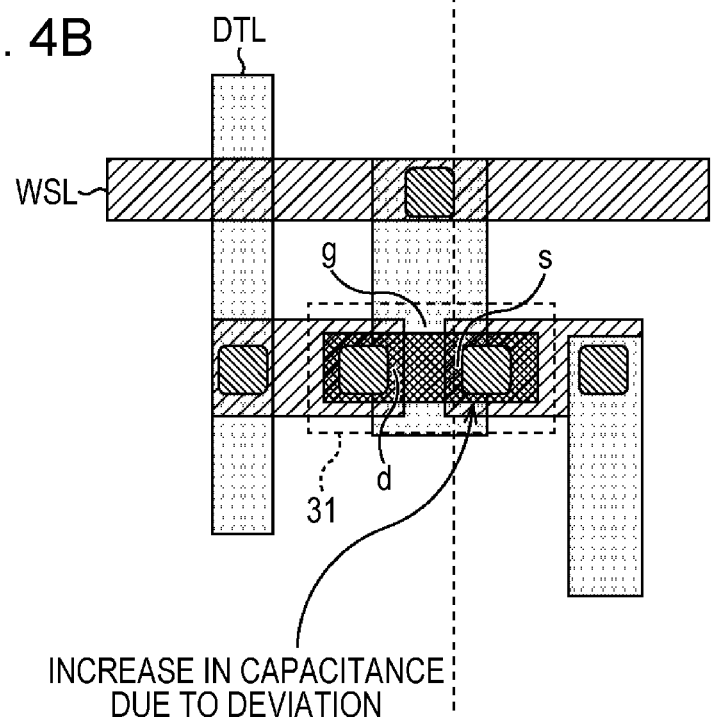

FIGS. 4A and 4B are enlarged views of a periphery of the sampling transistor 31 of FIG. 3. As illustrated in FIG. 4A, when an error (e.g., patterning and/or manufacturing errors) between the first metal layer and the second metal layer does not occur and thus deviations in these metal layers do not occur, the parasitic capacitance of the sampling transistor 31 does not change.

On the other hand, as illustrated in FIG. 4B, in the sampling transistor 31, when the first metal layer and the second metal layer include deviations, which are shown as a dotted line in FIG. 4B, the parasitic capacitance of the sampling transistor 31 increases due to the deviation. A portion where the parasitic capacitance is generated is a portion where the first metal layer as the gate g and the second metal layer as the source s overlap with each other, which is shown as an arrow in FIG. 4B.

When the parasitic capacitance of the sampling transistor 31 increases, a phenomenon occurs in which a gate potential of the driving transistor 32 instantaneously drops. Thus, when the amount of drop is different according to the pixels 21, the variation becomes a variation in luminance for each pixel, which may lead to a deterioration in the picture quality of the whole organic EL panel 10. However, it is difficult to completely remove the errors (e.g., patterning and/or manufacturing).

Consequently, a pixel configuration for suppressing an increase in the parasitic capacitance of the sampling transistor 31 when deviation of the metal layer occurs is proposed.

Configuration of Pixel

First, a configuration of a pixel will be described with reference to FIG. 5 (Note that items that have been previously discussed may be utilized to denote the same or similar items in subsequent Figures).

Figure 5:
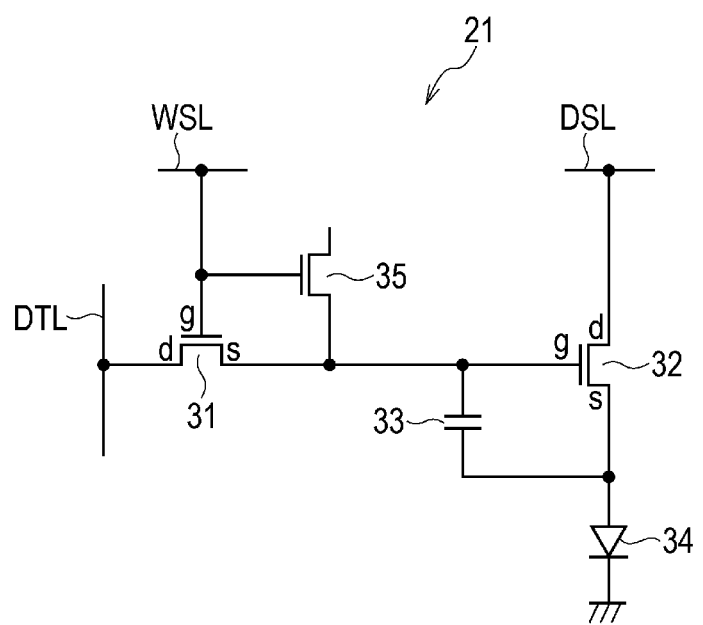
FIG. 5 is a circuit diagram illustrating a configuration of a pixel.

The pixel 21 of FIG. 5 is different from the pixel 21 of FIG. 2 in that a compensation capacitor 35 is between the gate g and the source s of the sampling transistor 31. In FIG. 5, the compensation capacitor 35 is configured as an element having a similar structure to a transistor.

That is, in the pixel 21 of FIG. 5, the compensation capacitor 35 may have a compensation relationship with the parasitic capacitance of the sampling transistor 31. Thus, when the parasitic capacitance of the sampling transistor 31 increases due to deviations occurring in the first metal layer and the second metal layer, the capacitance of the compensation capacitor 35 decreases by the amount of increase in the parasitic capacitance.

Thus, when the parasitic capacitance of the sampling transistor 31 increases, the capacitance of the compensation capacitor 35 is reduced by the amount of increase in the parasitic capacitance, i.e., a change in the total capacitance is suppressed. As a result, a variation in the parasitic capacitance of the sampling transistor 31 is suppressed.

Layout of Wiring Pattern of Pixel

Figure 6:
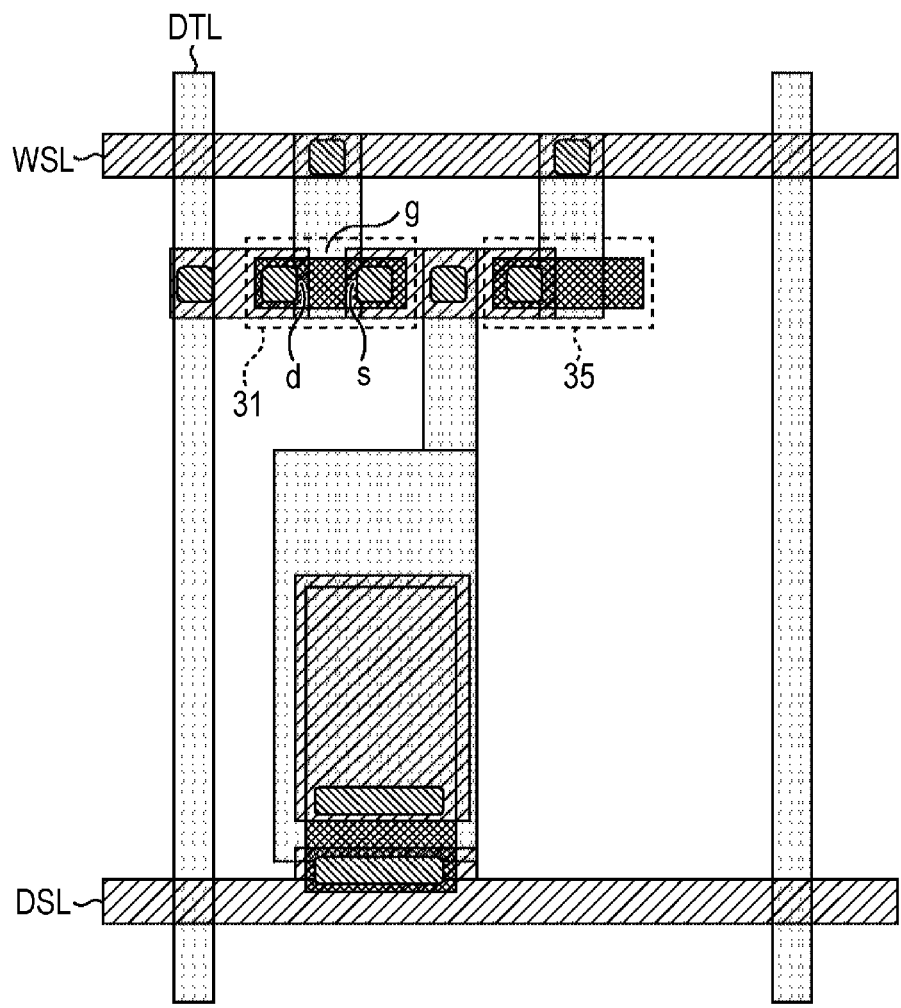
FIG. 6 is a diagram illustrating a layout of a wiring pattern of the pixel.
Figure 6:
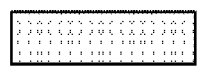
Figure 6:
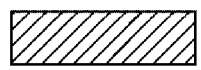
Figure 6:
Figure 6:

FIG. 6 is a diagram illustrating a layout of a wiring pattern of the pixel 21 of FIG. 5. For the purpose of simplifying the description, a description of the sampling transistor 31 and the compensation capacitor 35 structures are given.

As illustrated in FIG. 6, the compensation capacitor 35 may be equivalent to the first metal layer, the second metal layer, and a portion of the channel layer within the dotted line thereof. In the compensation capacitor 35, a portion that may be connected to the source s of the sampling transistor 31 may be formed of the second metal layer in the same manner as the source s of the sampling transistor 31. In addition, in the compensation capacitor 35, a portion that is connected to the scanning line WSL through the contact portion may be formed of the first metal layer in the same manner as the gate g of the sampling transistor 31.

In this manner, the compensation capacitor 35 is formed of the first metal layer and the second metal layer in the same manner as the sampling transistor 31. In turn, when deviation occurs in the first metal layer and the second metal layer, it is possible to reduce, by the compensation capacitor 35, capacitance by an amount of increase in parasitic capacitance that is generated in a portion where the first metal layer and the second metal layer of the sampling transistor 31 overlap with each other.

Figure 7A:
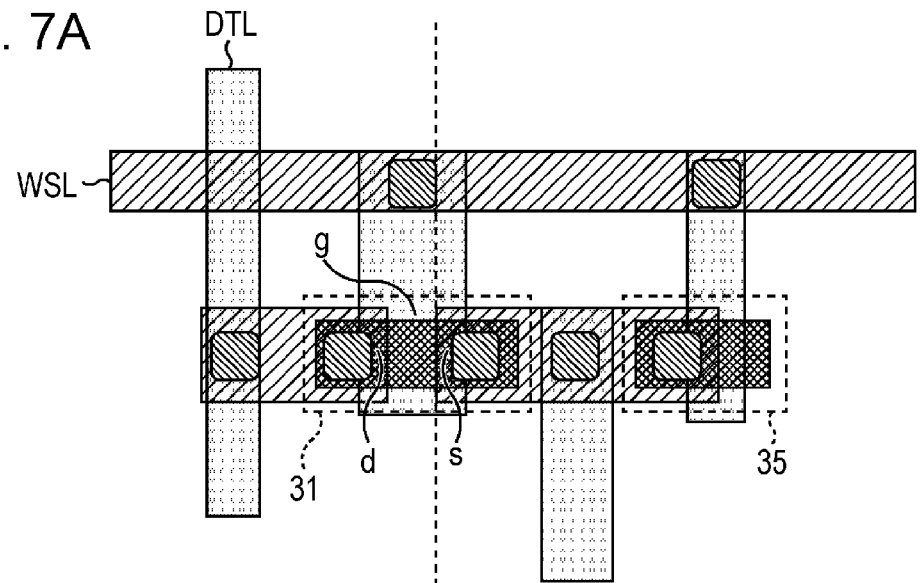
FIGS. 7A and 7B are diagrams illustrating compensation of capacitance due to deviation of a metal layer in the pixel.
Figure 7B:
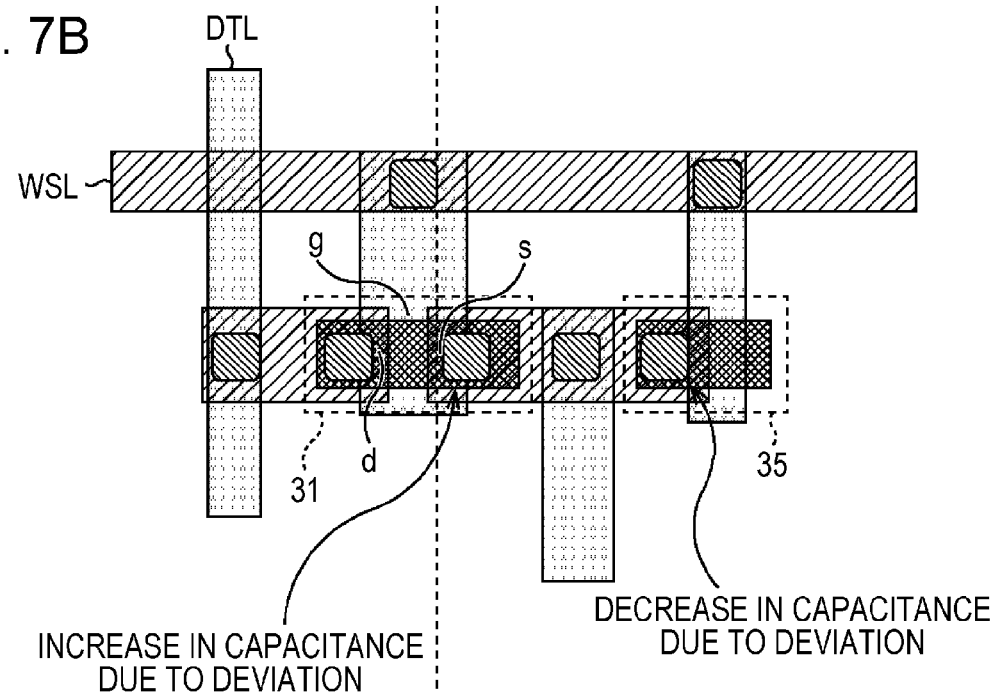

FIGS. 7A and 7B are enlarged views of peripheries of the sampling transistor 31 and the compensation capacitor 35 of FIG. 6.

As illustrated in FIG. 7A, when an error (e.g., patterning and/or manufacturing errors) between the first metal layer and the second metal layer does not occur (and thus there are no deviations in these metal layers), the parasitic capacitance of the sampling transistor 31 does not change.

On the other hand, as illustrated in FIG. 7B, in the sampling transistor 31, when the first metal layer and the second metal layer deviate include errors, which is shown as a dotted line in FIG. 7B, the parasitic capacitance increases due to the deviation. In this case, the compensation capacitor 35 has a compensation relationship with the parasitic capacitance of the sampling transistor 31. A compensation relationship may be when the capacitance of the compensation capacitor 35 is reduced in accordance with the increase in parasitic capacitance. Thus, any change in the parasitic capacitance of the sampling transistor 31 is compensated by the capacitance of the compensation capacitor 35.

In this way, a change in the total capacitance may be suppressed. Further, because the change in capacitance is suppressed, and thus a variation in the parasitic capacitance of the sampling transistor 31 is also suppressed. As a result, it is possible to suppress a variation in luminance for each pixel.

Example of Arrangement of Pixel

Figure 8:
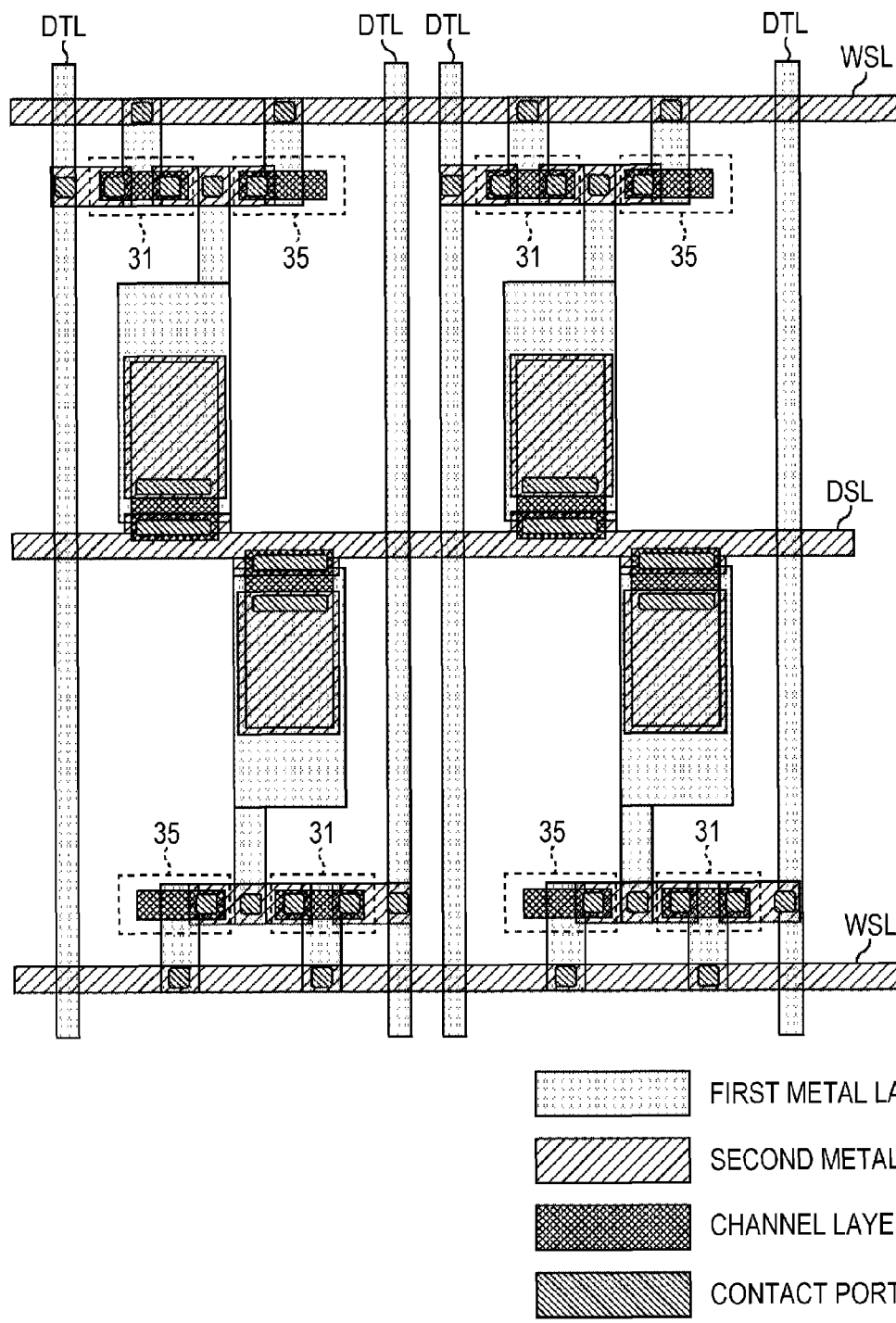
FIG. 8 is a diagram illustrating an example of the arrangement of the pixel.

FIG. 8 is a diagram illustrating an example of the arrangement of the pixel to which the present disclosure is applied.

FIG. 8 illustrates four pixels 21 adjacent to each other in a row direction and a column direction among M×N pixels 21 that are arranged in a matrix, in the pixel array portion 11 of the organic EL panel 10. In addition, among the four pixels 21, the pixels 21 adjacent to each other in the column direction have a point-symmetrical relationship centering around a symmetric point on the power line DSL.

Here, a case will be considered where deviation occurs in the first metal layer and the second metal layer due to a manufacturing error. For comparison, when a case is considered where the pixel 21 (FIG. 2) which is not provided with the compensation capacitor 35 is disposed in the same manner as FIG. 8, a direction of a change in the parasitic capacitance changes in two pixels 21 on the upper side and two pixels 21 on the lower side, and thus brightness changes in accordance with the arrangement of the pixels. On the other hand, as illustrated in FIG. 8, in the pixel 21 (FIG. 5) which is provided with the compensation capacitor 35, since the influence of a change in the parasitic capacitance of the sampling transistor 31 is suppressed by the compensation capacitor 35, a variation in luminance for each pixel is suppressed. Therefore, it is possible to prevent the brightness from changing in accordance with the arrangement of the pixels.

In FIG. 8, while an example has been described of a case where wiring patterns of pixels adjacent to each other in a column direction are arranged so as to be point-symmetrical to each other, the arrangement of the pixels is not limited thereto. The M×N pixels may be disposed so as to be point-symmetrical to other adjacent pixels in at least one of a row direction and a column direction.

Case where Transistor is Provided as Compensation Capacitor

In the above description, a case has been described where an element having a structure (structure formed of a metal layer, a channel layer, and the like) that is similar to a transistor is provided as the compensation capacitor 35, but a transistor may be also be provided instead of the element.

Figure 9:
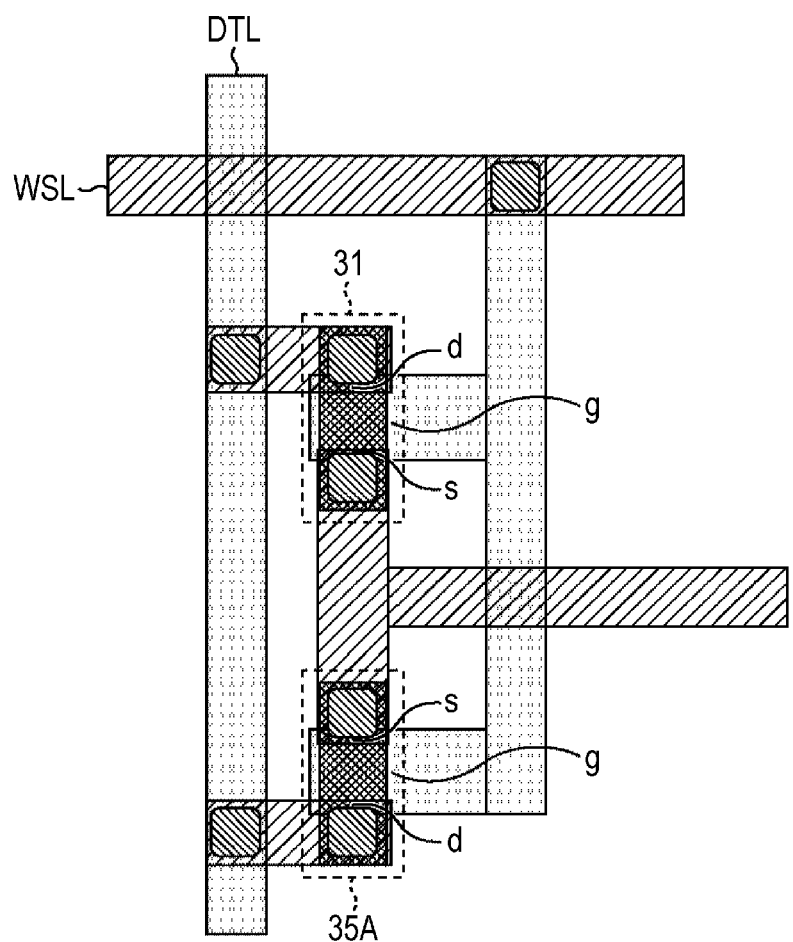
FIG. 9 is a diagram illustrating another layout of the wiring pattern of the pixel.

FIG. 9 is a diagram illustrating a layout of a wiring pattern of a pixel in a case where a transistor 35A is provided as the compensation capacitor 35. For the purpose of simplifying the description, a description of the transistor 35A structure is given.

As illustrated in FIG. 9, the transistor 35A may be equivalent to the first metal layer, the second metal layer, and a portion of the channel layer within the dotted line thereof, and may be formed as a thin film transistor. In the transistor 35A, the gate g thereof may be formed of the first metal layer and may be connected to the scanning line WSL through a contact portion.

In addition, in the transistor 35A, the source s and the drain d may be formed of the second metal layer. The source s is connected to the source s of the sampling transistor 31. In addition, the drain d is connected to the image signal line DTL through the contact portion.

That is, in the transistor 35A, a portion that is connected to the source s of the sampling transistor 31 may be formed of the second metal layer in the same manner as the source s of the sampling transistor 31. In addition, in the transistor 35A, a portion that is connected to the scanning line WSL through the contact portion may be formed of the first metal layer in the same manner as the gate g of the sampling transistor 31.

In this manner, the transistor 35A may be formed of the first metal layer and the second metal layer in the same manner as the sampling transistor 31. Thus, when deviation occurs in these metal layers, it is possible to reduce capacitance by the amount of increase in the parasitic capacitance of the sampling transistor 31.

In the description regarding FIG. 9, for convenience of description, the sampling transistor 31 is used as a transistor for sampling, and the transistor 35A is used as the compensation capacitor 35. However, since these transistors have the same configuration, it is also possible to use the transistor 35A as the transistor for sampling and to use the sampling transistor 31 as the compensation capacitor 35.

Case Where Capacitor is Provided as Compensation Capacitor

In addition, it is also possible to provide a capacitor as the compensation capacitor 35.

Figure 10:
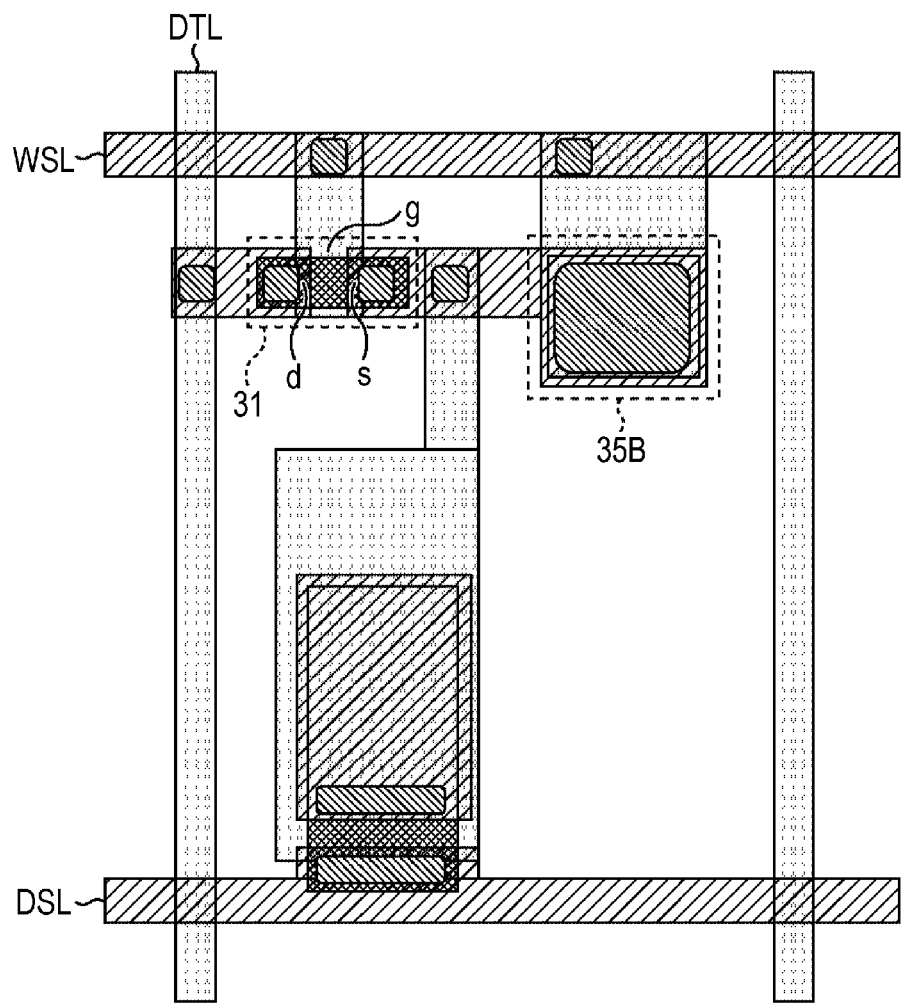
FIG. 10 is a diagram illustrating another layout of the wiring pattern of the pixel.

FIG. 10 is a diagram illustrating a layout of a wiring pattern of a pixel in a case where a capacitor 35B is provided as the compensation capacitor 35. For the purpose of simplifying the description, a description of the capacitor 35B structure is given.

As illustrated in FIG. 10, the capacitor 35B may be equivalent to portions of the first metal layer and the second metal layer (which face each other within the dotted line thereof), and may be formed of these conductors of the metal layers and an insulator provided there between. In the capacitor 35B, a portion that is connected to the source s of the sampling transistor 31 may be formed of the second metal layer in the same manner as the source s of the sampling transistor 31. In addition, in the capacitor 35B, a portion that is connected to the scanning line WSL through the contact portion may be formed of the first metal layer in the same manner as the gate g of the sampling transistor 31.

In this manner, the capacitor 35B may be formed of the first metal layer and the second metal layer in the same manner as the sampling transistor 31. Thus, when deviation occurs in the metal layers, it is possible to reduce capacitance by the amount of increase in the parasitic capacitance of the sampling transistor 31.

Further, while the element (FIG. 5 to FIG. 8), the transistor (FIG. 9), and the capacitor (FIG. 10) have been described, these elements are merely examples, and other elements may also be used, providing these other elements are formed of the first metal layer and the second metal layer in the same manner as the sampling transistor 31.

As described above, according to the present disclosure, the compensation capacitor 35 having a compensation relationship with the parasitic capacitance of the sampling transistor 31 is provided. Thus, even though the parasitic capacitance of the sampling transistor 31 increases due to deviation occurred in the first metal layer and the second metal layer, the capacitance of the compensation capacitor 35 is reduced by the amount of increase in the parasitic capacitance. Thus a change in the total capacitance can be suppressed.

In addition, the variation in the parasitic capacitance of the sampling transistor 31 disappears because of stabilized capacitance. Consequently, it is possible to suppress a variation in luminance for each pixel.

In addition, since the compensation capacitor 35 is used to compensate for the parasitic capacitance of the sampling transistor 31, it is possible to arrange the compensation capacitor 35 with a small circuit area without having an influence on the gate potential of the driving transistor 32. Thus, it is possible to suppress a variation in luminance for each pixel and to suppress an increase in circuit area.

In addition, from such a viewpoint, among the above-mentioned elements provided as the compensation capacitor 35 mentioned above, the element having a similar structure to a transistor can be arranged with a smallest circuit area.

Furthermore, since the compensation capacitor 35 includes the same metal layers (the first metal layer and the second metal layer) as the sampling transistor 31, the compensation capacitor may be formed within the pixel 21.

Details of Thin Film Transistor

Next, the sampling transistor 31 and the driving transistor 32 which are configured as a thin film transistor (TFT) will be described in detail.

Structure of Thin Film Transistor

Figure 11:
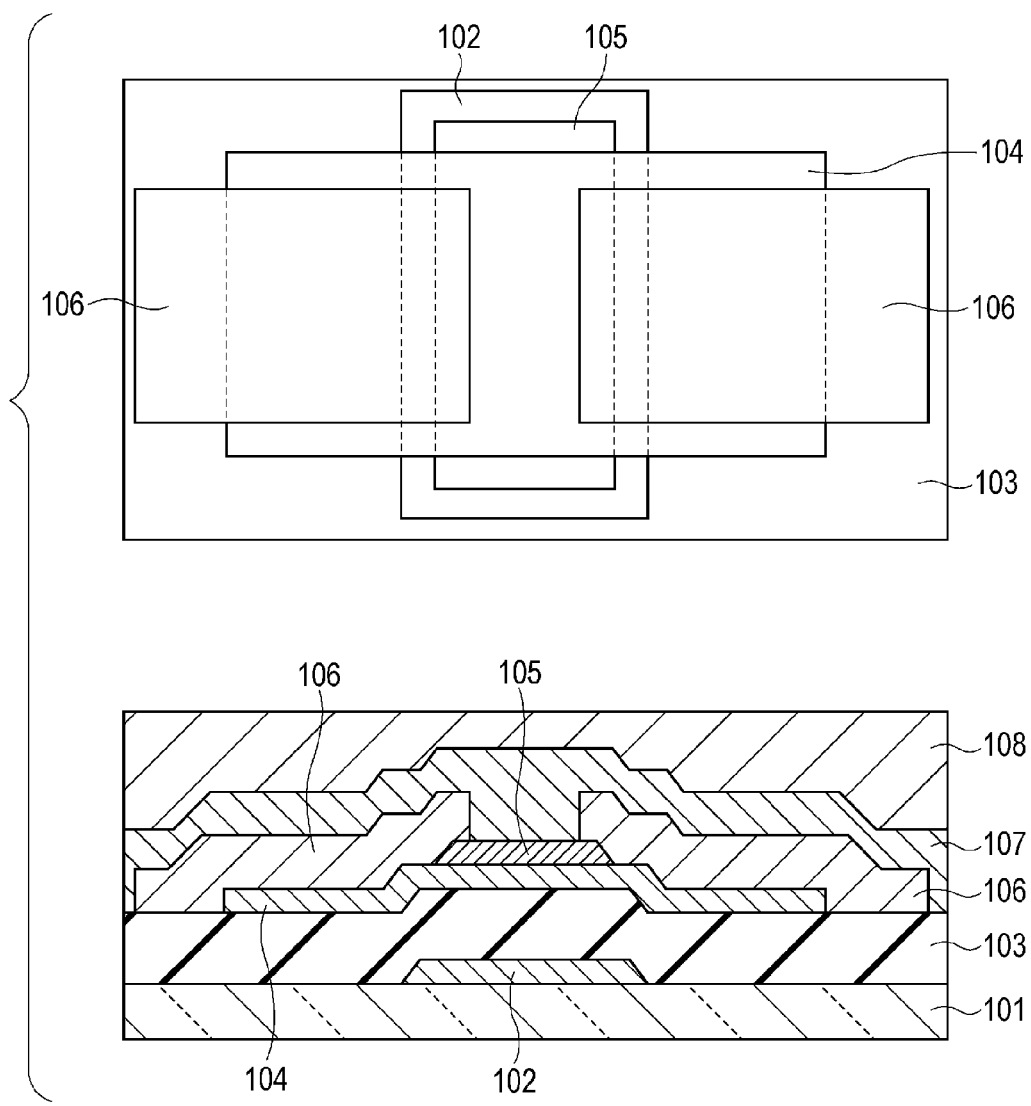
FIG. 11 is a diagram illustrating an example of a structure of a thin film transistor.

FIG. 11 is a diagram illustrating an example of a structure of a thin film transistor.

The thin film transistor may include a glass substrate 101, a gate electrode 102, a gate insulating film 103, an oxide semiconductor film 104, an etching stopper layer 105, and a source and drain electrode 106, and may be formed as a bottom gate type thin film transistor. In addition, herein, a passivation layer 107 for improving the reliability of the thin film transistor and a planarization layer 108 for planarizing the top of the device may be formed.

The gate electrode 102 is laminated on the glass substrate 101. The gate electrode 102 may be formed by a sputtering method, and herein, a metal wiring such as molybdenum, tungsten, aluminum, or titanium may be used. However, a conductive oxide film such as ITO may be used.

The gate electrode 102 controls the density of electrons within the oxide semiconductor film 104 in accordance with a gate voltage to be applied to the thin film transistor. The gate insulating film 103 may be formed on the gate electrode 102. The gate insulating film 103 may be formed by, for example, a plasma chemical vapor deposition (CVD) method, and a silicon oxide film, a silicon nitride film, aluminum oxide through sputtering, or the like may be used.

The oxide semiconductor film 104 may be formed on the gate insulating film 103, and may be patterned in an island shape. As an oxide semiconductor, an oxide may be formed of an element such as indium, gallium, zinc, aluminum, or tin via, for example, a sputtering method.

The etching stopper layer 105 may be formed on the oxide semiconductor film 104. As the etching stopper layer 105, a silicon oxide film may be formed by a CVD method or a sputtering method, or aluminum oxide may be formed by an atomic layer deposition (ALD) method or a sputtering method.

Subsequently, a gate oxide film may be etched after patterning the etching stopper layer 105 or at the same time as the etching stopper layer 105. Thereafter, the source and drain electrode 106 may be formed. As the source and drain electrode 106, a conductive oxide film such as molybdenum, tungsten, aluminum, titanium, or ITO may be used.

Examples of the passivation layer 107 may include a silicon oxide film or a silicon acid nitride film using a CVD method, a silicon oxide film or a silicon nitride film using a sputtering method, an aluminum oxide film using an atomic layer deposition (ALD) method, a silicon nitride film using a CVD method, a silicon nitride film using a sputtering method, an aluminum oxide film using an ALD method, and the like.

Next, the planarization layer 108 may be formed for the purpose of planarizing the device. The planarization layer 108 may be formed by applying an organic material such as acrylic, polyimide, or novolac by a spin coating method or a slit coating method and by baking the organic material. Also, oxygen may be supplied to a channel layer by using annealing, dinitrogen monoxide plasma, oxygen plasma, or the like in an oxygen atmosphere after any one of or a plurality of the formation of the channel, the formation of the source and drain electrode 106, the formation of the passivation layer 107, and the formation of the planarization layer 108, to reduce oxygen defects in the channel layer.

Method of Manufacturing Thin Film Transistor

Next, a method of manufacturing a thin film transistor will be described.

First, molybdenum of 180 nm may be formed on the entire surface of the glass substrate 101 by a sputtering method, and then photolithography and etching may be performed on this thin film, thereby forming the gate electrode 102.

Subsequently, the gate insulating film 103 may be configured by forming a silicon oxide film of 300 nm on the entire surfaces of the glass substrate 101 and the gate electrode 102 by a CVD method. Thereafter, as the oxide semiconductor film 104, indium oxide gallium zinc of 50 nm may be formed by a sputtering method, and photolithography and etching may be performed thereon, thereby forming the oxide semiconductor film 104.

Thereafter, a silicon oxide film of 200 nm may be formed as the etching stopper layer 105 on the oxide semiconductor film 104 by a CVD method. However, before forming this film, for example, a process of supplying oxygen to the oxide semiconductor film 104 such as dinitrogen monoxide plasma or oxygen plasma may be introduced.

Subsequently, photolithography and etching may be performed on this thin film, and thus the etching stopper layer 105 may be formed in an island shape on a channel region. Subsequently, a gate oxide film may be formed in an island shape by performing photolithography and etching. Thereafter, a laminated film that may be constituted by titanium of 50 nm, aluminum of 200 nm, and titanium of 50 nm may be formed on a channel protection film or the oxide semiconductor film 104 by a sputtering method, and photolithography and etching may be performed on this thin film, thereby forming the source and drain electrode 106.

Thereafter, aluminum oxide may be formed by a sputtering method, and photolithography and etching may be performed on this thin film, thereby forming the passivation layer 107. In addition, processing may be performed for two hours under an atmosphere of oxygen:nitrogen=40:60 and 300° C. for the purpose of supplying oxygen to a channel region of the oxide semiconductor film 104. Thereafter, a polyimide film having a thickness of 2 μm may be applied using a spin coating method and may then be baked, thereby forming the planarization layer 108. In this manner, the thin film transistor may be manufactured.

As stated above, the thin film transistor has been described in detail.

Application Example of the Present Disclosure

Figure 12:
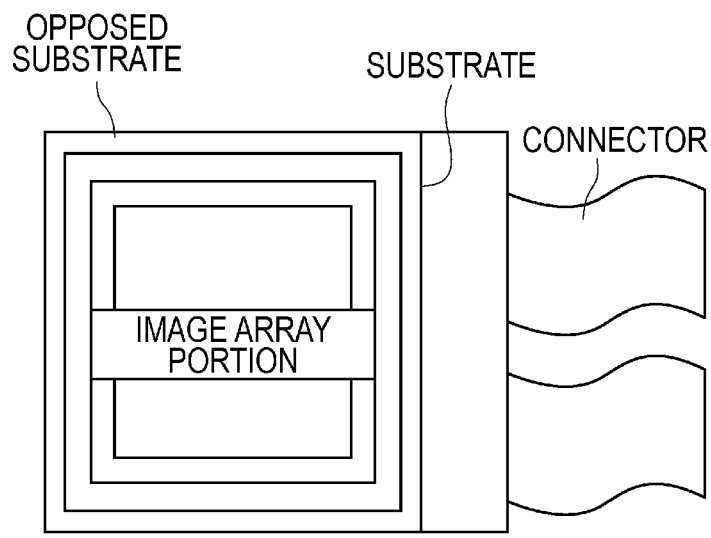
FIG. 12 is a diagram illustrating a configuration of a display module.

The display device, which may be configured by using the organic EL panel 10 as a principle part, and to which the present disclosure may be applied, includes a device having a flat type module shape as illustrated in FIG. 12. This type of display module may be manufactured by providing a pixel array portion in which pixels constituted by a thin film transistor, a capacitor, a light-emitting element, etc. are arranged in a matrix on, for example, an insulating substrate, by placing an adhesive to surround the pixel array portion and by attaching an opposing substrate, such as glass, thereto.

A color filter, a protection film, a light-shielding film, or the like may be provided in the transparent opposing substrate. In addition, the display module may be provided with, for example, a flexible printed circuit (FPC) as a connector for inputting and outputting a signal or the like with respect to the pixel array portion from the outside.

In addition, the above-mentioned display device may have a flat type panel shape, and may be applied to various electronic apparatuses. For example, the display device may be applied to electronic apparatuses, such as a television receiver, a digital still camera, a notebook type personal computer, a mobile phone, a smart phone, a digital video camera, a tablet type computer, or the like. In other words, the display device may be applied to displays of all kinds of electronic apparatuses that display a driving signal, which is input to the electronic apparatus or is generated within the electronic apparatus, as a picture or an image.

Hereinafter, an electronic apparatus to which such a display device is applied will be exemplified. The electronic apparatus includes a main body that processes information, and a display unit that displays information to be input to the main body or information to be output from the main body.

Figure 13:
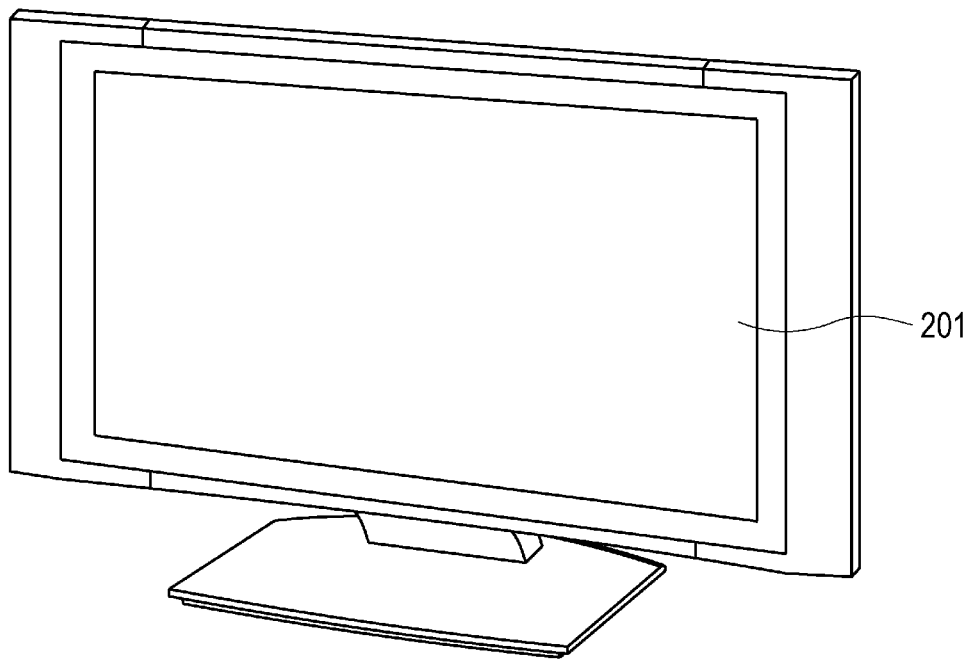
FIG. 13 is a perspective view illustrating a contour of a television receiver.

FIG. 13 is a perspective view illustrating a contour of a television receiver to which the present disclosure is applied. The television receiver is manufactured by using the display device to which the present disclosure is applied, as a display unit 201 that is constituted by a front panel, a filter glass, and the like.

Figure 14:
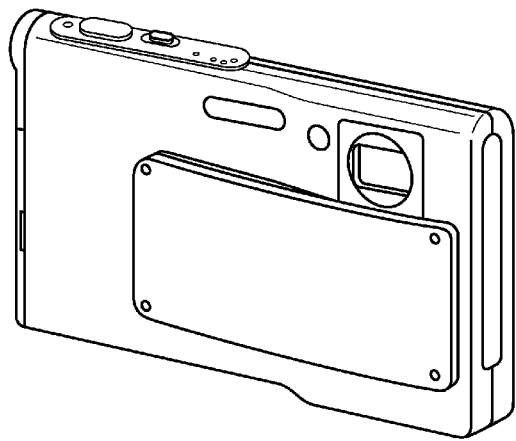
FIG. 14 is a perspective view illustrating a contour of a digital still camera.
Figure 14:
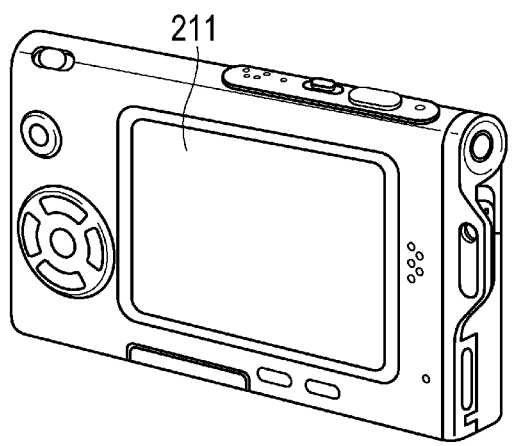

FIG. 14 is a perspective view illustrating a contour of a digital still camera to which the present disclosure is applied. However, a front view and a rear view are respectively shown on the upper side and the lower side of FIG. 14. The digital still camera is manufactured by using the display device to which the present disclosure is applied, as a display unit 211 for displaying a captured image, a menu screen, or the like. Meanwhile, when the digital still camera has an electronic viewfinder, it is also possible to use the display device to which the present disclosure is applied, in the electronic viewfinder.

Figure 15:
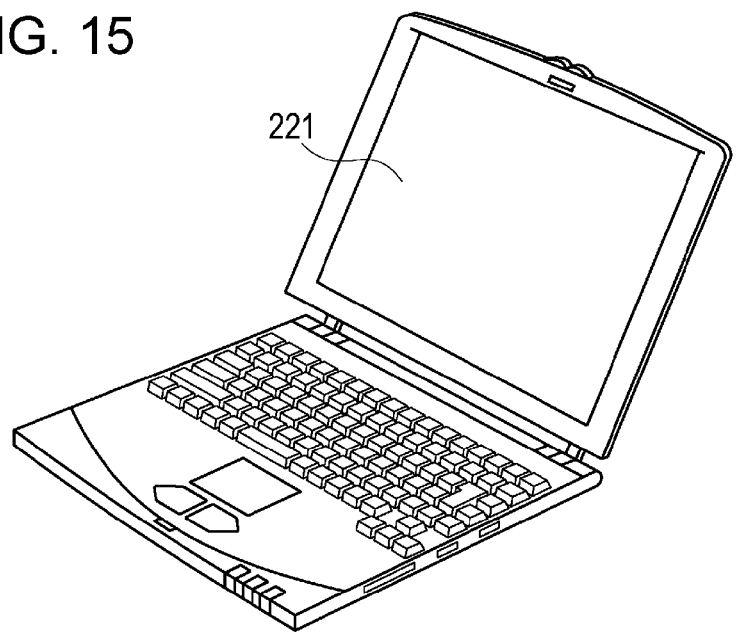
FIG. 15 is a perspective view illustrating a contour of a notebook type personal computer.

FIG. 15 is a perspective view illustrating a contour of a notebook type personal computer to which the present disclosure is applied. The notebook type personal computer is manufactured by using the display device to which the present disclosure is applied, as a display unit 221 that displays a picture or an image.

Figure 16:
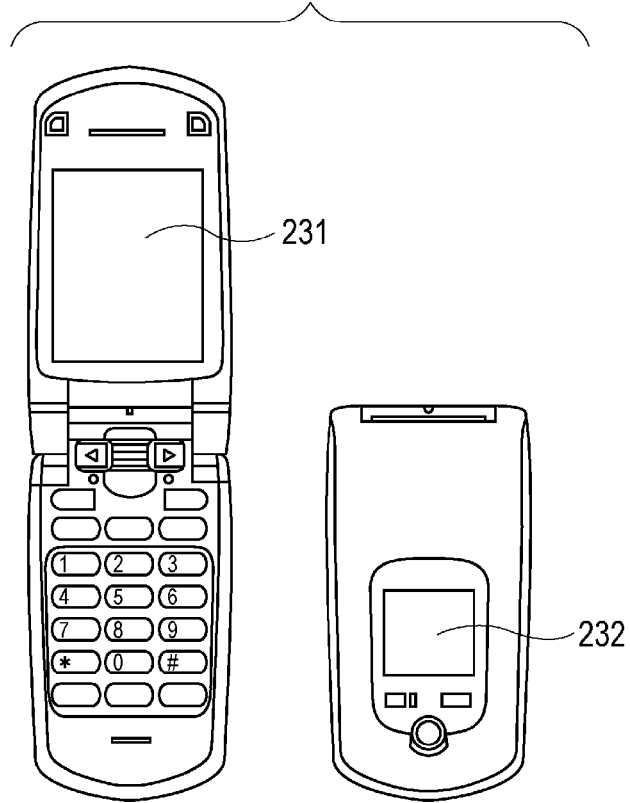
FIG. 16 is a perspective view illustrating a contour of a mobile phone.

FIG. 16 is a perspective view illustrating a contour of a mobile phone to which the present disclosure is applied. The mobile phone is a folding type mobile phone, and an opened state and a closed state of the mobile phone are respectively shown on the left side and the right side of FIG. 16. The mobile phone is manufactured by using the display device to which the present disclosure is applied, as a main display unit 231 capable of being viewed in an opened state and a sub-display unit 232 capable of being viewed in a closed state.

Figure 17:
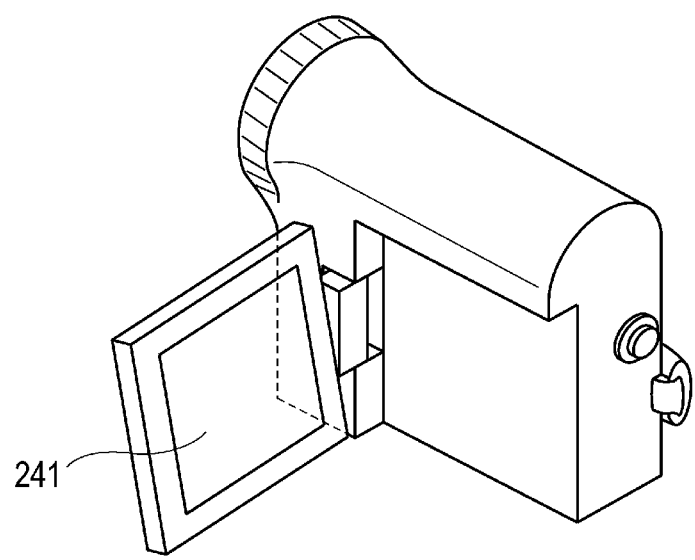
FIG. 17 is a perspective view illustrating a contour of a digital video camera.

FIG. 17 is a perspective view illustrating a contour of a digital video camera to which the present disclosure is applied. The digital video camera is manufactured by using the display device to which the present disclosure is applied, as a display unit 241 for displaying an image, a menu screen, or the like.

As stated above, the application example of the present disclosure has been described.

Also, the above-mentioned pixel circuit of the pixel 21 is an example. That is, providing there is a pixel circuit including two transistors (sampling transistor and driving transistor), a holding capacitor, and a light-emitting element, the present disclosure may be applied (even in a case where any of other pixel circuits are employed). For example, it is possible to compensate for a change in the parasitic capacitance of each transistor by providing the compensation capacitor in the pixel circuit that is disclosed in Japanese Unexamined Patent Application Publication No. 2005-31630 (FIG. 1).

In addition, in the above description, as the thin film transistor, a bottom gate type thin film transistor in which a gate electrode is provided on the substrate side rather than a semiconductor film has been described, but it is also possible to employ a top gate type thin film transistor in which a semiconductor film is provided on the substrate side rather than a gate electrode.

In addition, the embodiment of the present disclosure is not limited to the above-mentioned embodiment, and various modifications thereof can be made without departing from the scope of the present disclosure.

It should be noted that the present disclosure may also take the following configurations:

(1) A pixel circuit, comprising:
a first transistor having a first deviation that results in a parasitic capacitance; and
a compensation element having a second deviation that results in a compensatory capacitance that compensates for the parasitic capacitance.

(2) The pixel circuit of (1), wherein the compensatory capacitance compensates for the parasitic capacitance according to a compensation relationship between the first and second deviation.

(3) The pixel circuit of (1), wherein the second deviation is proportional to the first deviation.

(4) The pixel circuit of (1), wherein the first deviation is based on a first overlap between a gate and a source of the first transistor.

(5) The pixel circuit of (1), wherein the second deviation is based on a second overlap that is proportional to the first overlap.

(6) The pixel circuit of (1), wherein the second deviation causes a decrease of a capacitance of the compensation element to offset an increase of the parasitic capacitance caused by the first deviation.

(7) The pixel circuit of (1), wherein the second deviation causes an increase of a capacitance of the compensation element to offset a decrease of the parasitic capacitance caused by the first deviation.

(8) The pixel circuit of (1), wherein the compensation element is a second transistor.

(9) The pixel circuit of (8), wherein
a source of the first transistor connects to a source of the second transistor,
a gate of the first transistor and a gate of the second transistor connect to a signal line, and
a drain of the first transistor and a drain of the second transistor connect to an image line.

(10) The pixel circuit of (1), wherein the compensation element is a capacitor.

(11) The pixel circuit of (10), wherein a portion of the capacitor connects to the source of the first transistor.

(12) The pixel of (1), wherein
a gate of the first transistor is a first metal layer,
a source of the first transistor is a second metal layer, and
the first deviation is an overlap between the first metal layer and the second metal layer.

(13) The pixel of (1), further comprising:
a drive transistor, and
wherein a gate of the first transistor is connected to a signal line and a source of the first transistor is connected to a gate of the drive transistor.

(14) The pixel circuit of (1), where the first transistor and the compensation element are arranged a first direction.

(15) Wherein the pixel circuit of (1) is one pixel circuit of a plurality of pixel circuits.

(16) The plurality of pixel circuits of (15), wherein the one pixel circuit has a point-symmetrical relationship with another pixel circuit of the plurality of pixel circuits.

(17) The plurality of pixel circuits of (16), wherein the point-symmetrical relationship is when the one pixel circuit is symmetrically mirrored around a point on a power line by the another pixel circuit.

(18) A display device comprising the pixel circuit of (1).

(19) An electronic apparatus comprising the display device of (18).

(20) A pixel circuit, comprising:
a first transistor;
a holding capacitor;
a first metal portion connected to the holding capacitor; and
a second metal portion,
wherein
the first transistor includes a channel portion connected to the first metal portion,
the first metal portion includes a first edge and a second edge opposite to the first edge,
the first edge is disposed to overlap with a gate electrode of the first transistor,
the second edge is disposed to overlap with the second metal portion, and
the gate electrode of the first transistor and the second metal portion are the same material.

(21) The pixel circuit according to (20), the gate electrode of the first transistor is arranged at a same layer as the second metal portion.

Moreover, it should be noted that the present disclosure may also take the following configurations:

[1] A display device including:
a pixel circuit,
wherein the pixel circuit includes
a light-emitting element that emits light in response to a driving current,
a first transistor that samples an image signal,
a holding capacitor that holds a predetermined potential according to the sampling through the first transistor, a second transistor that supplies the driving current to the light-emitting element in response to the predetermined potential that is held in the holding capacitor, and a compensation capacitor that compensates for a change in parasitic capacitance that is generated within the circuit.

[2] The display device according to [1], wherein the first transistor is a thin film transistor, and wherein the compensation capacitor is formed to include a first metal layer and a second metal layer which forms the thin film transistor, and reduces capacitance according to an amount of increase in parasitic capacitance of the thin film transistor when the parasitic capacitance of the thin film transistor increases due to deviation of the first metal layer and the second metal layer.

[3] The display device according to [2], wherein the compensation capacitor is provided as a thin film transistor which is formed to include the first metal layer and the second metal layer.

[4] The display device according to [2], wherein the compensation capacitor is provided as a capacitor which is formed to include the first metal layer and the second metal layer.

[5] The display device according to any one of [1] to [4], wherein in a pixel array portion in which row-like scanning lines and power lines and column-like image signal lines are arranged, a plurality of the pixel circuits are disposed in portions where the scanning lines and the image signal lines intersect with each other, and wherein the pixel circuits are disposed so as to be point-symmetrical to other adjacent pixel circuits in at least one of a row direction and a column direction in the pixel array portion.

[6] An electronic apparatus having a display device mounted thereto, wherein the display device includes a pixel circuit, and wherein the pixel circuit includes a light-emitting element that emits light in response to a driving current, a first transistor that samples an image signal, a holding capacitor that holds a predetermined potential according to the sampling through the first transistor, a second transistor that supplies the driving current to the light-emitting element in response to the predetermined potential that is held in the holding capacitor, and a compensation capacitor that compensates for a change in parasitic capacitance that is generated within the circuit.

It should be understood by those skilled in the art that various modifications, combinations, sub-combinations and alterations may occur depending on design requirements and other factors insofar as they are within the scope of the appended claims or the equivalents thereof.

What is claimed:

1. A pixel circuit, comprising:
an organic light-emitting element;
a first transistor having a first deviation that results in a parasitic capacitance; and
a compensation element having a second deviation that results in a compensatory capacitance that compensates for the parasitic capacitance, wherein
the compensation element is a second transistor,
a source of the first transistor connects to a source of the second transistor,
a gate of the first transistor and a gate of the second transistor connect to a signal line, and
a drain of the first transistor and a drain of the second transistor connect to an image line.

2. The pixel circuit of claim 1, wherein the compensatory capacitance that compensates for the parasitic capacitance is according to a compensation relationship between the first deviation and the second deviation.

3. The pixel circuit of claim 1, wherein the second deviation is proportional to the first deviation.

4. The pixel circuit of claim 1, wherein the first deviation is based on a first overlap between the gate and the source of the first transistor.

5. The pixel circuit of claim 4, wherein the second deviation is based on a second overlap that is proportional to the first overlap.

6. The pixel circuit of claim 1, wherein the second deviation causes a decrease of a capacitance of the compensation element to offset an increase of the parasitic capacitance caused by the first deviation.

7. The pixel circuit of claim 1, wherein the second deviation causes an increase of a capacitance of the compensation element to offset a decrease of the parasitic capacitance caused by the first deviation.

8. The pixel circuit of claim 1, wherein
the gate of the first transistor is a first metal layer,
the source of the first transistor is a second metal layer, and
the first deviation is an overlap between the first metal layer and the second metal layer.

9. The pixel circuit of claim 1, further comprising:
a drive transistor, and
wherein the gate of the first transistor is connected to the signal line and the source of the first transistor is connected to a gate of the drive transistor.

10. The pixel circuit of claim 1, where the first transistor and the compensation element are arranged a first direction.

11. A plurality of pixel circuits comprising:
at least one pixel circuit including
an organic light-emitting element;
a first transistor having a first deviation that results in a parasitic capacitance; and
a compensation element having a second deviation that results in a compensatory capacitance that compensates for the parasitic capacitance, wherein
the compensation element is a second transistor,
a source of the first transistor connects to a source of the second transistor,
a gate of the first transistor and a gate of the second transistor connect to a signal line, and
a drain of the first transistor and a drain of the second transistor connect to an image line.

12. The plurality of pixel circuits of claim 11, wherein the at least one pixel circuit has a point-symmetrical relationship with another pixel circuit of the plurality of pixel circuits.

13. The plurality of pixel circuits of claim 12, wherein the point-symmetrical relationship is the at least one pixel circuit symmetrically mirrored around a point on a power line by the another pixel circuit.

14. A display device comprising:
a pixel circuit including
an organic light-emitting element
a first transistor having a first deviation that results in a parasitic capacitance; and
a compensation element having a second deviation that results in a compensatory capacitance that compensates for the parasitic capacitance, wherein
the compensation element is a second transistor,
a source of the first transistor connects to a source of the second transistor, a gate of the first transistor and a gate of the second transistor connect to a signal line, and a drain of the first transistor and a drain of the second transistor connect to an image line.

15. The display device of claim 14, wherein the first deviation is based on a first overlap between the gate and the source of the first transistor, and wherein the second deviation is based on a second overlap that is proportional to the first overlap.

16. The display device of claim 14, wherein the second deviation causes a decrease of a capacitance of the compensation element to offset an increase of the parasitic capacitance caused by the first deviation.

17. The display device of claim 14, wherein the second deviation causes an increase of a capacitance of the compensation element to offset a decrease of the parasitic capacitance caused by the first deviation.

18. The display device of claim 14, wherein
the gate of the first transistor is a first metal layer,
the source of the first transistor is a second metal layer, and
the first deviation is an overlap between the first metal layer and the second metal layer.

19. The display device of claim 14, further comprising:
a drive transistor, and
wherein the gate of the first transistor is connected to the signal line and the source of the first transistor is connected to a gate of the drive transistor.

20. An electronic apparatus comprising:
a display device including
a pixel circuit including
an organic light-emitting element;
a first transistor having a first deviation that results in a parasitic capacitance; and
a compensation element having a second deviation that results in a compensatory capacitance that compensates for the parasitic capacitance, wherein
the compensation element is a second transistor,
a source of the first transistor connects to a source of the second transistor,
a gate of the first transistor and a gate of the second transistor connect to a signal line, and
a drain of the first transistor and a drain of the second transistor connect to an image line.

* * * * *